United States Patent
Ozawa et al.

(10) Patent No.: US 10,044,265 B1
(45) Date of Patent: Aug. 7, 2018

(54) SWITCHING CONVERTER CONTROL ROBUST TO ESL RIPPLE

(71) Applicant: Dialog Semiconductor (UK) Limited, London (GB)

(72) Inventors: Seiichi Ozawa, Saitama (JP); Daisuke Kobayashi, Tokyo (JP)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/662,569

(22) Filed: Jul. 28, 2017

(51) Int. Cl.
| | |
|---|---|
| *H02M 3/156* | (2006.01) |
| *H02M 3/158* | (2006.01) |
| *H02M 1/14* | (2006.01) |
| *H03F 1/02* | (2006.01) |
| *H03F 3/195* | (2006.01) |
| *H03F 3/24* | (2006.01) |

(52) U.S. Cl.
CPC ......... *H02M 3/156* (2013.01); *H02M 3/1588* (2013.01); *H03F 1/0216* (2013.01); *H03F 3/195* (2013.01); *H03F 3/24* (2013.01)

(58) Field of Classification Search
CPC ......... H02M 3/156; H02M 2003/1566; H02M 3/158; H02M 3/1582; H02M 3/1584; H02M 3/588; H02M 1/14
See application file for complete search history.

(56) References Cited

U.S. PATENT DOCUMENTS

| | | | | |
|---|---|---|---|---|
| 6,459,246 B1 * | 10/2002 | Roo | ........................ | G05F 1/575 |
| | | | | 323/270 |
| 7,002,817 B2 * | 2/2006 | Lipcsei | .................. | H02M 3/156 |
| | | | | 323/282 |
| 7,609,040 B1 | 10/2009 | Jain | | |
| 8,054,058 B2 | 11/2011 | Liu et al. | | |
| 9,013,160 B2 * | 4/2015 | Shih | ........................ | G05F 1/467 |
| | | | | 323/273 |
| 9,535,438 B2 * | 1/2017 | Yuan | ...................... | H02M 3/156 |
| 9,602,002 B2 * | 3/2017 | Yamane | ................ | H02M 3/158 |
| 9,806,617 B1 * | 10/2017 | Ozawa | .................. | H02M 3/158 |
| 2011/0025283 A1 * | 2/2011 | Futamura | ............ | H02M 3/1588 |
| | | | | 323/282 |
| 2014/0159686 A1 * | 6/2014 | Lee | ........................ | H02M 3/156 |
| | | | | 323/282 |

(Continued)

FOREIGN PATENT DOCUMENTS

WO WO 2007/107919 9/2007

*Primary Examiner* — Timothy J Dole
*Assistant Examiner* — Sisay G Tiku
(74) *Attorney, Agent, or Firm* — Saile Ackerman LLC; Stephen B. Ackerman (57) ABSTRACT

An object of the disclosure is to provide cancelling of the output voltage deviation in a switching converter, caused by Equivalent Series Inductance (ESL) of the output capacitor, using switching node information. A further object of the disclosure is to eliminate a step-like voltage deviation in the equalized output, further eliminating the need to increase the Panic comparator offset reference, and eliminating the need to reduce the bandwidth of the pulse-width modulation control loop. Still further, another object of the disclosure is to merge some of the new components depending on the circuit topology. Still further, another object of the disclosure is to implement the new components with the same silicon as the control block, for matching the output voltage ripple and the cancelling signal control.

27 Claims, 10 Drawing Sheets

(56) References Cited

U.S. PATENT DOCUMENTS

| | | | |
|---|---|---|---|
| 2014/0266110 A1* | 9/2014 | Yuan | H02M 3/156 323/282 |
| 2014/0292298 A1* | 10/2014 | Pradhan | H02M 3/1588 323/286 |
| 2015/0155784 A1* | 6/2015 | Ouyang | H02M 3/1563 323/285 |
| 2016/0141957 A1* | 5/2016 | Ozawa | G01R 19/00 323/271 |
| 2016/0359414 A1* | 12/2016 | Ozanoglu | H02M 3/1582 |
| 2017/0093278 A1* | 3/2017 | Unno | H02M 3/156 |
| 2018/0019671 A1* | 1/2018 | Li | H02M 3/156 |

\* cited by examiner

SWITCHING CONVERTER CONTROL ROBUST TO ESL RIPPLE

BACKGROUND

Field

The disclosure relates generally to load transient regulation of a switching converter, in response to output voltage change.

Description

For switching converters used for supplying processors and memories, quick response to output voltage deviation is required, to compensate for voltage drop due to rapid and large load current change. Recent switching converters include high-speed blocks, such as panic comparators, to respond to output voltage change. In those blocks, the high frequency components are amplified for faster response.

On the other hand, for mobile applications, demand for downsizing is increasing. Smaller output inductors and capacitors are preferred. But as a drawback, small inductors cause large output voltage deviation, together with Equivalent Series Inductance (ESL) of the output capacitor. This is an obstacle to improving the load transient regulation, because the capability of the high-speed blocks needs to be improved to avoid the wrong reaction of switching converters due to ESL ripple.

Figure 1:
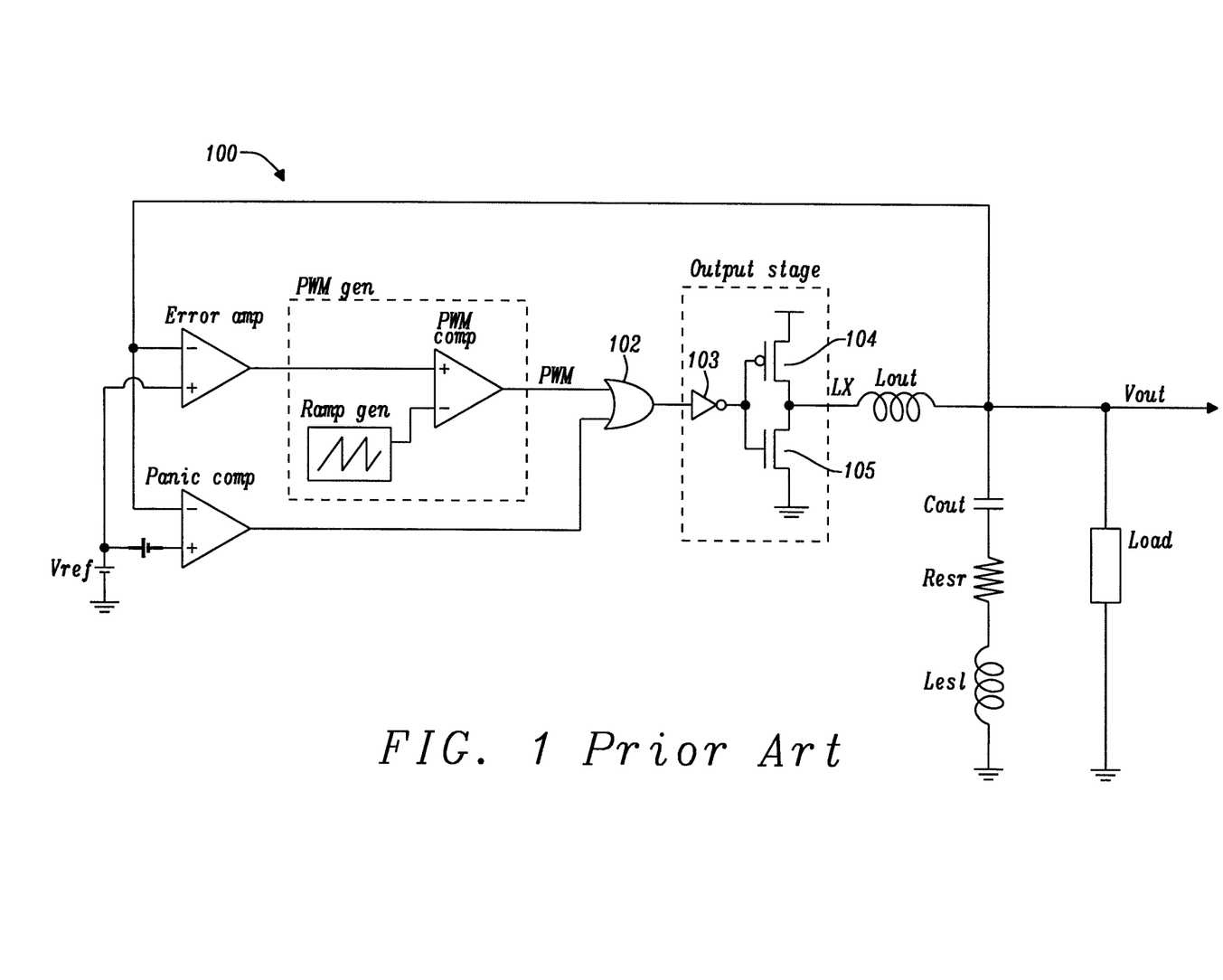
FIG. 1 illustrates a block diagram of the current practice, for response to output voltage deviation, in a switching converter of the prior art.

FIG. 1 illustrates block diagram 100 of the current practice, for response to output voltage deviation, in a switching converter of the prior art. It comprises normal pulse-width modulation control loop PWM gen, OR gate 102, which receives the PWM and Panic comparator output signals, and an Error amplifier. The Error amplifier and Panic comparator receive Vout on their inverting inputs, and reference voltage Vref on their non-inverting inputs, and need to react quickly to a change on output voltage Vout. The block diagram further comprises an Output stage, comprising inverter 103, and high side device 104 and low side device 105, and Output inductor Lout, and Load. Output capacitor Cout has parasitic resistance Resr and parasitic inductance LesI, and the parasitic resistance and parasitic inductance cause a voltage ripple on Vout.

Figure 2:
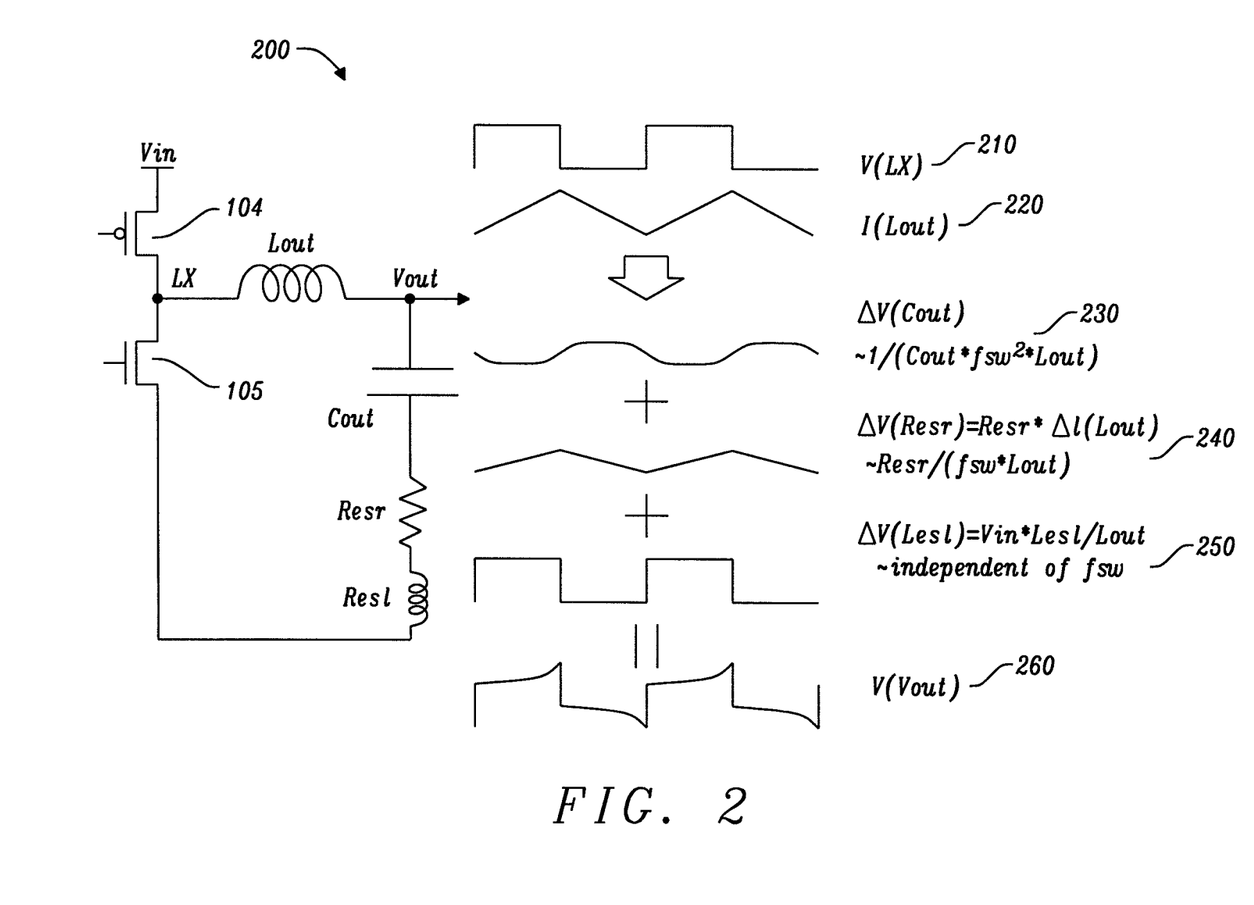
FIG. 2 shows timing diagrams, for response to output voltage deviation, in the switching converter of FIG. 1

FIG. 2 shows timing diagrams 200, for response to output voltage deviation, in the switching converter of FIG. 1. Triangular shape inductor current I(Lout) 220 is translated into output voltage ripple (Vout) 260 on Δ(Cout) 230, Δ(Resr) 240 and Δ(LesI) 250. Note that increasing the switching frequency fsw can reduce the contributions from Cout and Resr, since ΔV(Cout) 230 is approximately 1/([Cout×(fsw)(fsw)×Lout)], and ΔV(Resr) 240 is [Resr×DI(Lout)], and approximately [Resr/(fsw×Lout)]. ΔV(LesI) 250 is Vin×LesI/Lout, independent of fsw.

Thus, as noted, the ESL voltage ripple ΔV(LesI), of the output capacitor parasitic inductance LesI, is independent of fsw and cannot be eliminated. As the voltage ripple is inversely proportional to inductance element Lout of the output inductor, deviation due to ESL becomes more severe in current switching converters. Also the ESL voltage ripple is directly proportional to input voltage Vin, the effect will be more significant as the conversion ratio Vin/Vout becomes larger.

Figure 3:
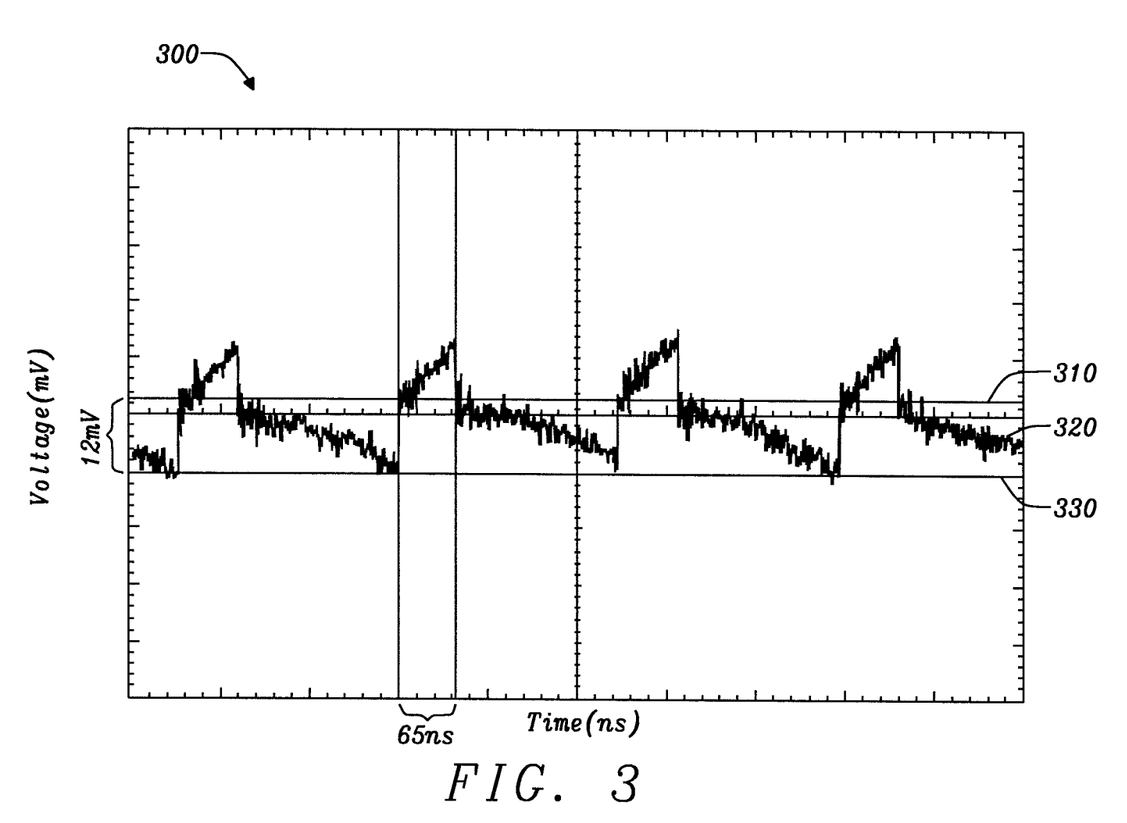
FIG. 3 shows an actual waveform of the output voltage, for response to output voltage deviation, in the switching converter of FIG. 1.

FIG. 3 shows actual waveform 300 of the output voltage, for response to output voltage deviation, in the switching converter of FIG. 1. The output inductor Lout is 0.1 uH and the output capacitor Cout parasitic inductance LesI is about 0.4 nH. A step-like voltage change of 12 mV occurs repetitively due to equivalent series inductance of the output capacitor. Since this change is very steep, and includes a high frequency component, it could seriously affect the controls. The X-axis is labeled as time, with the waveform period about 250 ns, and the distance between the solid vertical lines as 65 ns. The Y-axis is labeled as voltage, with the voltage jump indicated by two horizontal lines as 12 mV.

The panic comparator capability may be compromised, so that it does not react to the output voltage deviation. The offset of the threshold upper and lower limits, 310 and 330 respectively, may be set larger than the deviation, or the response speed may be made slower to ignore the deviation. But these modifications degrade the load transient response and worsen the transient regulation.

SUMMARY

An object of the disclosure is to provide cancelling of the output voltage deviation in a switching converter, caused by Equivalent Series Inductance (ESL) of the output capacitor, using switching node information.

A further object of the disclosure is to eliminate a step-like voltage deviation in the equalized output, further eliminating the need to increase the Panic comparator offset reference, and eliminating the need to reduce the bandwidth of the pulse-width modulation control loop.

Still further, another object of the disclosure is to merge some of the new components depending on the circuit topology.

Still further, another object of the disclosure is to implement the new components with the same silicon as the control block, for matching the output voltage ripple and the cancelling signal control.

To accomplish the above and other objects, a switching converter control circuit is disclosed, robust to Equivalent Series Inductance (ESL), comprising a switching converter, further comprising an output stage, configured to provide an output signal through an inductor, where the inductor is connected to an output capacitor at an output of the switching converter. A control block drives the output stage based on the input from the PWM signal generator, and a reference. Novel components include a logic gate to invert the output stage voltage, with about the same or proportional voltage swing as the output stage, and a voltage divider. The divider attenuates the output voltage of the inverter and generates the cancelling signal. It can be either resistive or capacitive in nature. Novel components also include an adder, to sum the cancelling signal with the output of the switching converter. The adder output drives a control input, on a high-frequency path to the inverting input of the Error amplifier and Panic comparator.

The above and other objects are further achieved by a method for a switching converter control robust to Equivalent Series Inductance (ESL), embodying the principles of the disclosure. The steps include providing a switching converter, comprising an output stage and a control block. The steps also include generating a signal swing proportional to an output signal of the output stage, by inverting the output signal with a logic gate. The steps also include attenuating an output voltage of the logic gate, to generate a cancelling signal. The steps also include adding the cancelling signal to an output signal of the switching converter, to generate a control signal input.

In various embodiments the function may be achieved using a voltage divider comprising a second resistor and a second capacitor connected between the logic gate output and the analog adder, and a first resistor connected between the output signal of the switching converter and the analog adder.

In various embodiments the function may be achieved using a Panic comparator comprising a transconductance amplifier, a current comparator, and a high pass amplifier, where the internal node of the output stage of the switching converter supplies a cancelling capacitor through an inverter, the cancelling capacitor connected to an input capacitor at a resistor, and the high pass amplifier causing the Panic comparator to work predictively using a $1^{st}$ order Taylor approximation In various embodiments the function may be achieved using a Buck, Boost, or Buck-Boost DC-DC switching converter.

In various embodiments the function may be achieved using a multi-phase (N-phase) Buck switching converter.

In various embodiments the function may be achieved using a hysteretic type converter.

DETAILED DESCRIPTION

The present disclosure provides cancelling the output voltage deviation in a switching converter, using switching node information. Since when to turn on and off the switching devices is known, theoretically the output voltage deviation can be predicted and cancelled.

Figure 4:
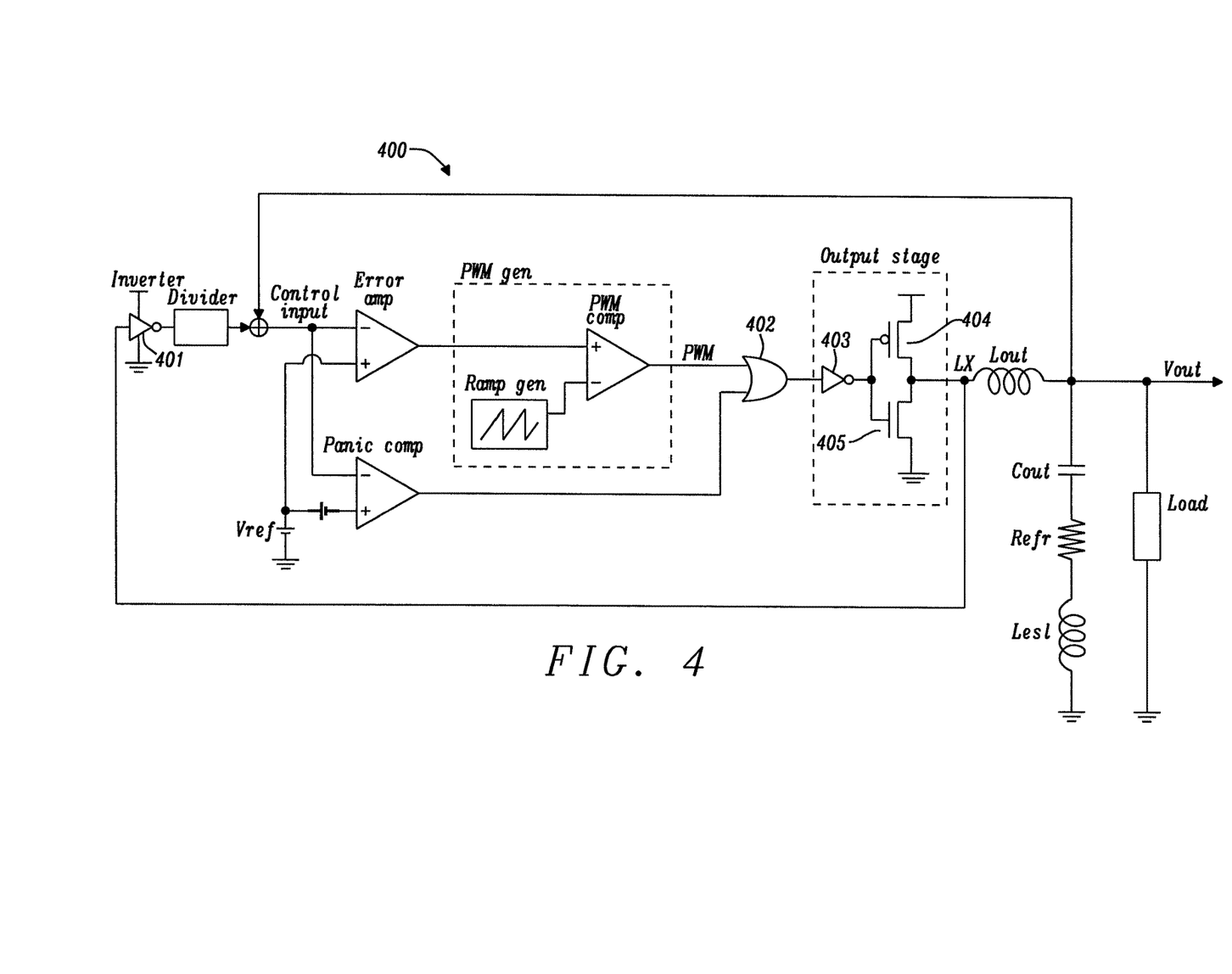
FIG. 4 illustrates a block diagram, illustrating the basic concept of cancelling the output voltage deviation in a switching converter, embodying the principles of the disclosure.

FIG. 4 shows block diagram 400, illustrating the basic concept of cancelling the output voltage deviation in a switching converter, of the disclosure. It comprises normal pulse-width modulation control loop PWM gen, OR gate 402, which receives the PWM and Panic comparator output signals, and an Error amplifier. The Error amplifier and Panic comparator receive reference voltage Vref on their non-inverting inputs, and need to react quickly to a change on output voltage Vout. The block diagram further comprises an Output stage, comprising inverter 403, high side device 404 and low side device 405. Output capacitor Cout has parasitic resistance Resr and parasitic inductance LesI. The parasitic resistance and parasitic inductance cause a voltage ripple on Vout that can be cancelled, in the disclosure.

Inverter 401 is configured to generate the inverted signal of voltage LX, from the Output stage of the switching converter. The input to the logic gate inverter can be the internal node of the output stage, as far as it can generate the inverted signal, and it is supplied with the same voltage as the output stage. The swing of the Inverter is then input voltage Vin, almost the same as internal node voltage LX. This is important in cancelling the ESL voltage ripple, regardless of Vin deviation.

A voltage Divider attenuates the output of the Inverter, to adjust the swing of the cancelling signal. Since the swing of the ESL voltage ripple is $\Delta V(LesI)=Vin*LesI/Lout$, the attenuation ratio is ideally about LesI/Lout. Note that it is possible to adjust the attenuation ratio dynamically, but not essential, since both the output inductor and voltage ripple are constant and stable. The attenuated output of the Divider is input to an analog adder, along with output voltage Vout of the switching converter. The result is a control signal, input to both the Error amplifier and Panic comparator inverted inputs. Since a step-like voltage deviation is eliminated in the equalized output, the need to increase the Panic comparator offset reference, or to reduce the bandwidth of the pulse-width modulation control loop is eliminated.

Essential components of the disclosure are a switching converter, with an inductor connected between the output stage and a capacitor. A control block drives the output stage based on the input from the PWM signal generator, and a reference. Key, novel components of the disclosure include a logic gate to invert the output stage voltage, with about the same or proportional voltage swing as the output stage, and a voltage divider. The divider attenuates the output voltage of the inverter and generates the cancelling signal. It can be either resistive or capacitive in nature. New components also include an analog adder, to sum the cancelling signal with the output of the switching converter. The adder output drives a control input, on a high-frequency path to the inverting input of the Error amplifier and Panic comparator. Some of the novel components can be merged depending on the circuit topology. Also preferably, the novel components are implemented with the same silicon as the control block, for matching the output voltage ripple and the cancelling signal control.

Figure 5:
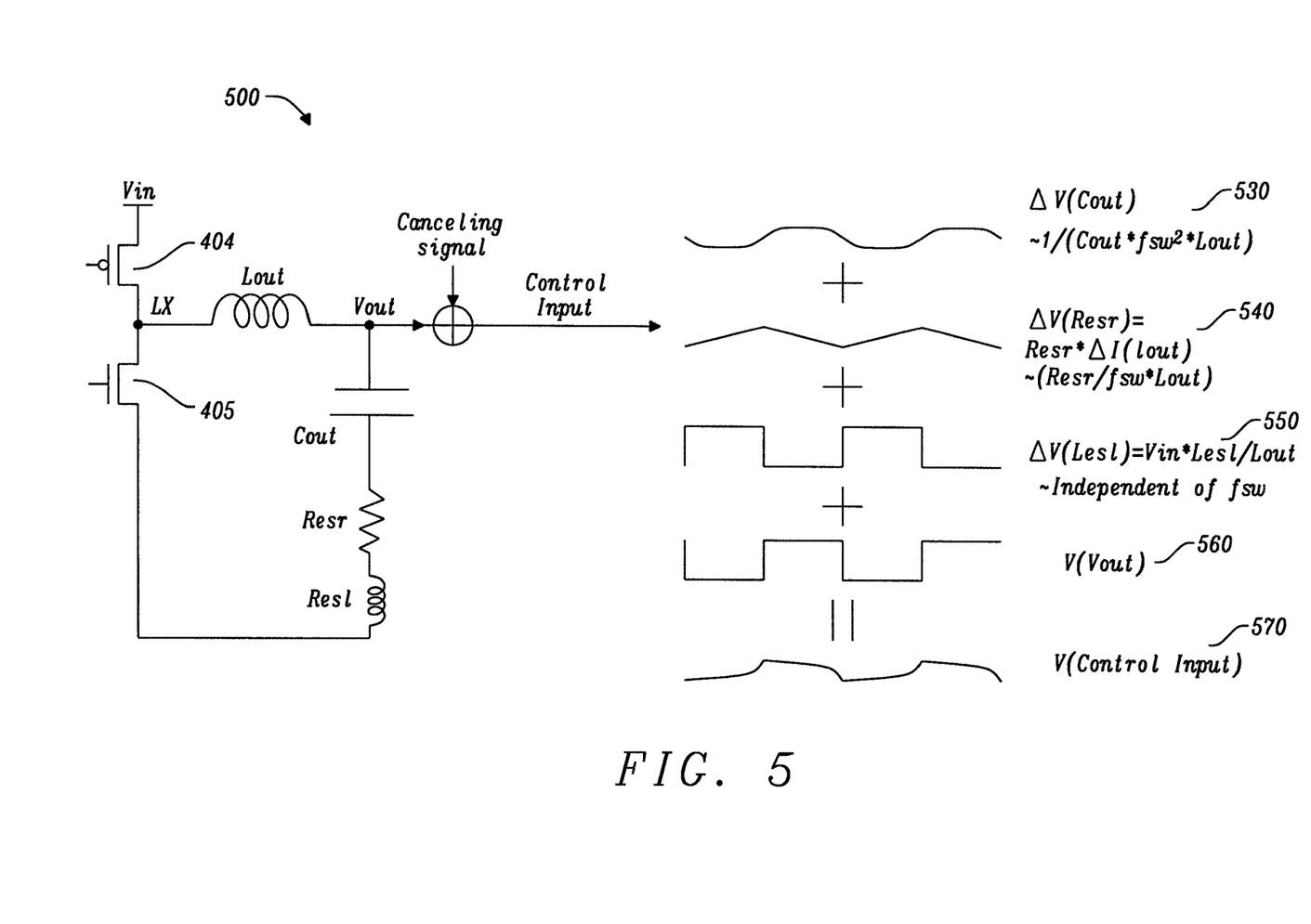
FIG. 5 shows timing diagrams, for the response to output voltage deviation, in the switching converter of the disclosure.

FIG. 5 shows timing diagrams 500, for response to output voltage deviation, in the switching converter of the disclosure. Adding the cancelling signal, shown in control input voltage 570, eliminates ESL voltage ripple on output voltage Vout 560 of the switching converter. The inductor current is translated into output voltage ripple on $\Delta V(Cout)$ 530, $\Delta V(Resr)$ 540 and $\Delta V(LesI)$ 550. Note that increasing the switching frequency fsw can reduce contribution from Cout and Resr, since $\Delta V(Cout)$ 530 is approximately $1/([Cout\times(fsw)(fsw)\times Lout])$, and $\Delta V(Resr)$ 540 is $[Resr\times DI(Lout)]$, and approximately $[Resr/(fsw\times Lout)]$. $\Delta V(LesI)$ 250 is $Vin\times LesI/Lout$, independent of fsw.

Now the ESL voltage ripple, of the output capacitor parasitic inductance is eliminated. In the disclosure, output voltage Vout 560 is shown to have a square signal shape, as compared to output voltage Vout 260, of the prior art. Output voltage deviation is now cancelled in the switching converter, using internal node information LX as input to Inverter 401. This is important in eliminating the ESL voltage ripple, because when to turn on and off the switching devices is known, and the output voltage deviation can now be predicted and cancelled.

Figure 6:
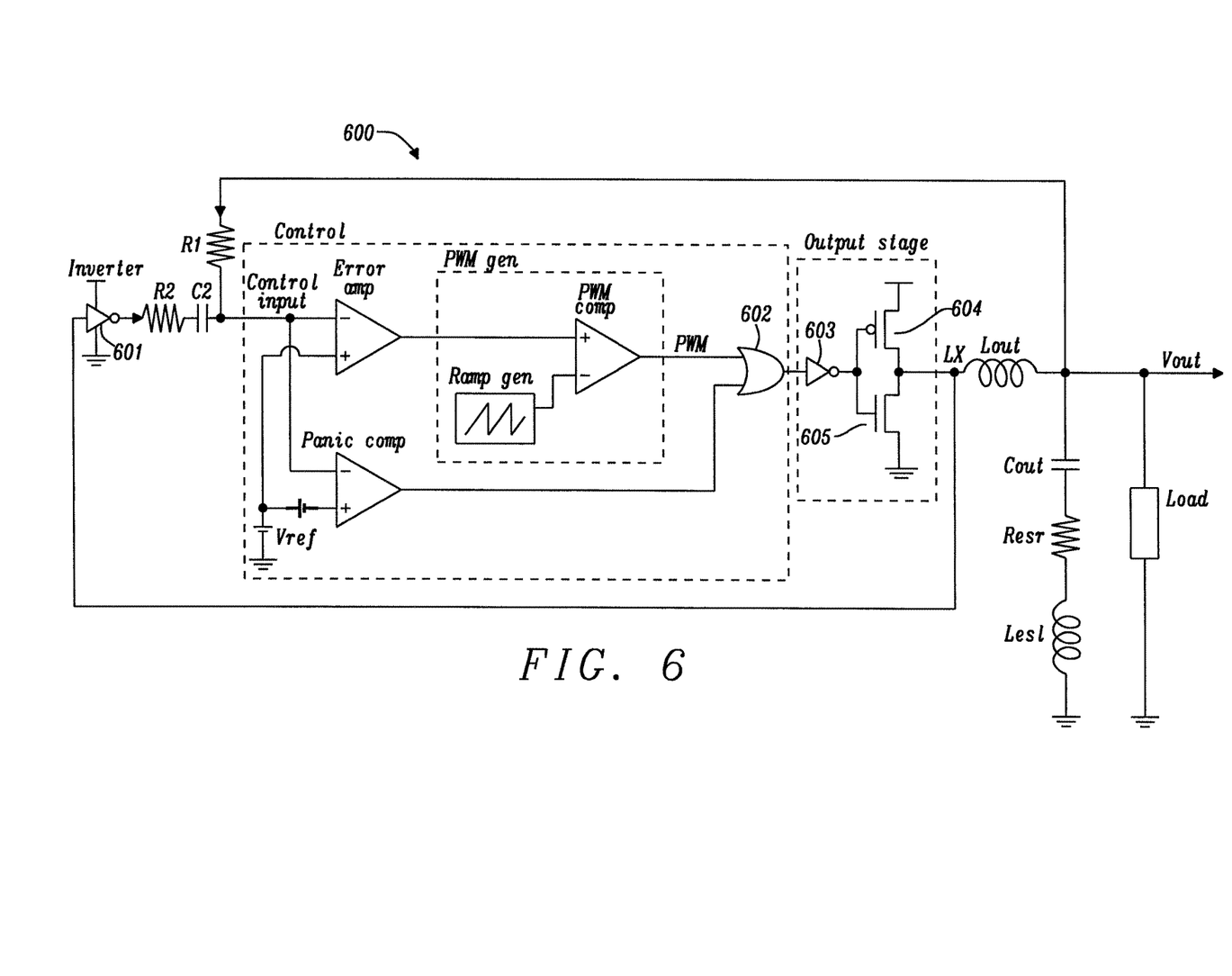
FIG. 6 shows a block diagram of a first embodiment of cancelling the output voltage deviation in a switching converter.

FIG. 6 shows block diagram 600, a first embodiment of cancelling the output voltage deviation in a switching converter. It comprises normal pulse-width modulation control loop PWM gen, OR gate 602, which receives the PWM and Panic comparator output signals, and an Error amplifier. The Error amplifier and Panic comparator receive reference voltage Vref on their non-inverting inputs, and need to react quickly to a change on output voltage Vout of the switching converter. The block diagram further comprises an Output stage, comprising inverter 603, and high side device 604 and low side device 605.

In FIG. 6, resistor R1 is now connected between output voltage Vout and capacitor C2, and resistor R2 is now connected between the output of Inverter 601 and capacitor C2. Devices R1 and R2 comprise the Divider of FIG. 4, and capacitor C2 and the Inverter comprise the circuitry for generating the cancelling signal. The attenuation ratio of the resistors R1/R2 is set to LesI/Lout for a swing matching the ESL voltage ripple and the cancelling signal, since ΔV(LesI)=Vin*LesI/Lout. C2 is inserted so that the cancelling does not affect the DC level of the output voltage, and is set much smaller than output capacitance Cout. And the time constant R2*C2 is set much larger than the switching period.

Figure 7:
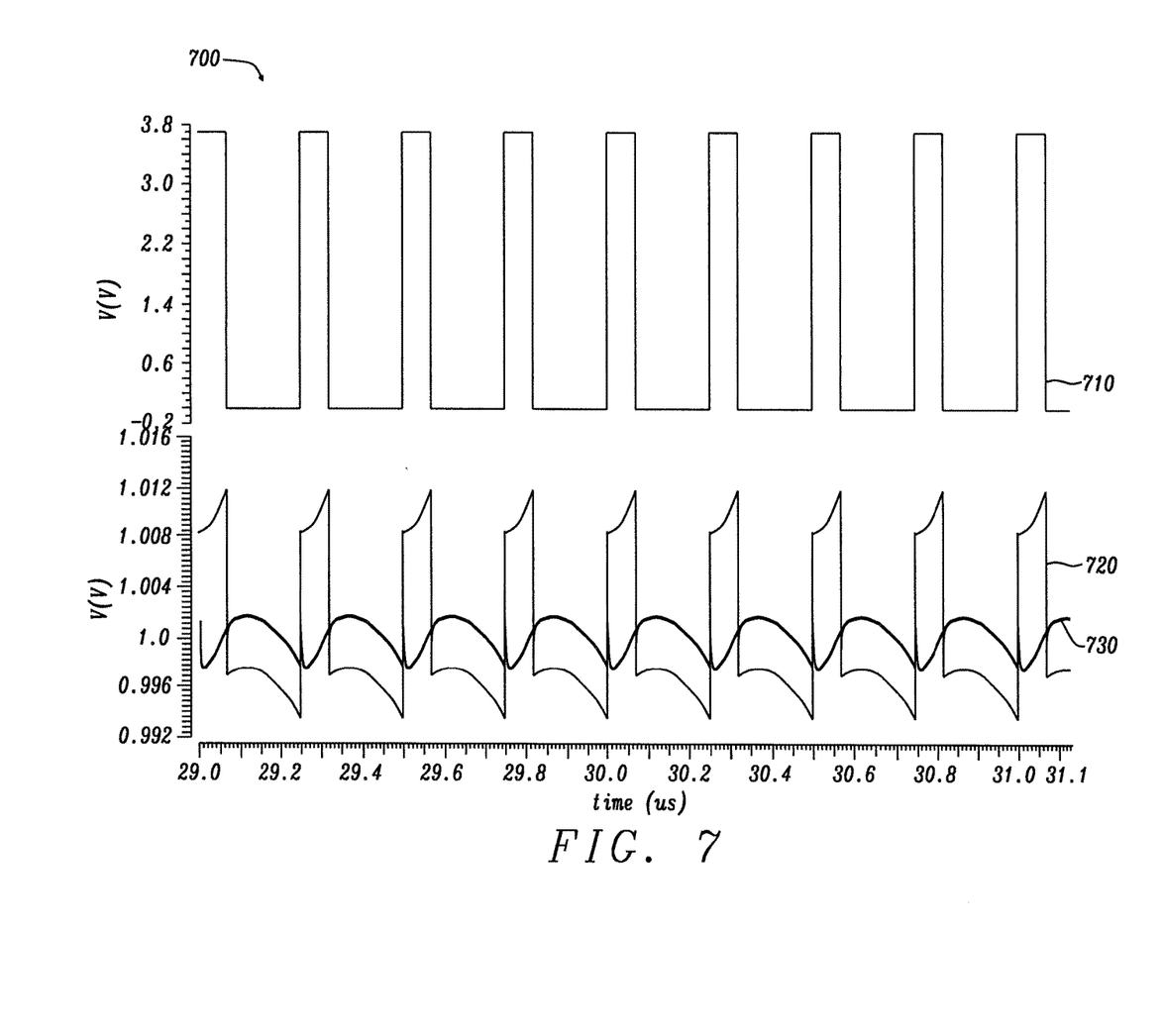
FIG. 7 illustrates the simulation results of a first embodiment of cancelling the output voltage deviation in a switching converter of FIG. 6.

FIG. 7 illustrates simulation results 700 of a first embodiment of cancelling the output voltage deviation, in the switching converter of FIG. 6. The ESL output voltage ripple, induced on output voltage Vout 720, by parasitic output inductance 0.1 uH and parasitic output capacitance 0.4 nH, is successfully cancelled. Control input 730 is designed to cancel the ripple, as shown on internal node LX 710, input to Inverter 601.

Figure 8:
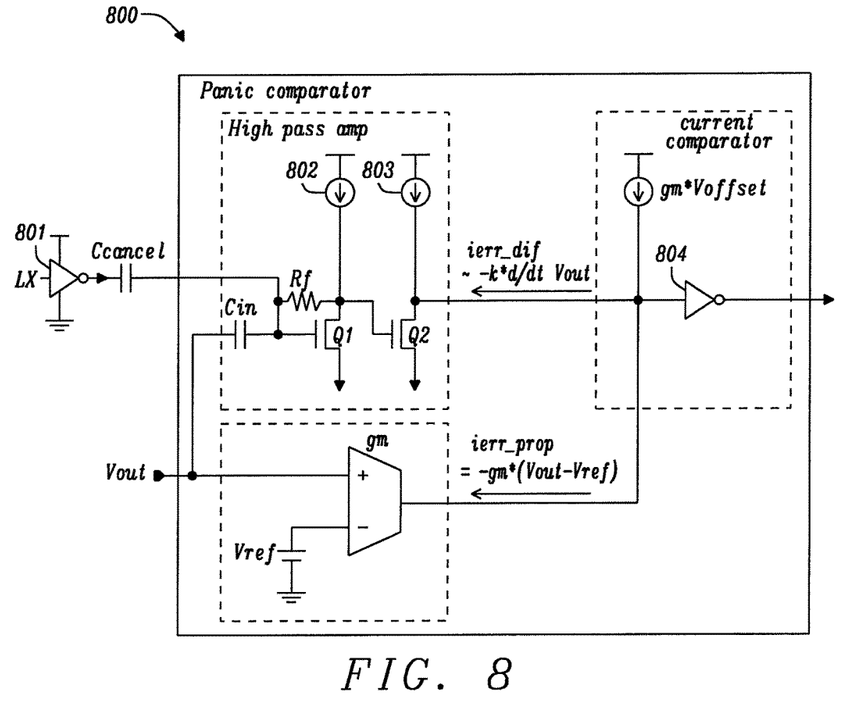
FIG. 8 shows a second embodiment, with the panic comparator and cancelling circuit of the switching converter.

FIG. 8 shows second embodiment 800, with the panic comparator and cancelling circuit of the switching converter. ESL output voltage ripple is cancelled as part of the control input, similar to FIG. 4. The panic comparator is comprised of transconductance gm, a current comparator, and a high pass amplifier. Transconductance gm receives output voltage Vout on its non-inverting input and reference voltage Vref on its inverting input. The current comparator comprises a current source set to gm*Voffset, at the input of inverter 804. The high pass amplifier comprises current sources 802 and 803, at the drains of devices Q1 and Q2, respectively. Input capacitor Cin, connected between the output voltage and the gate of Q1, is virtually grounded by Q1. Resistor Rf is connected between the gate and drain of Q1, also the gate of Q2. The drain of Q2 is also at the input to inverter 804. Inverter 801 receives internal node LX from the output stage of the switching converter, and drives capacitor Ccancel. Ccancel is also connected to capacitor Cin at resistor Rf.

The high pass amplifier causes the panic comparator to work predictively. Current from output voltage Vout to capacitor Cin is proportional to the differential of Vout, and is amplified by devices Q1,Q2, and resistor Rf, and then output through inverter 804. The high pass amplifier is sensitive to noise, and ESL ripple is translated into large noise, making it worthwhile to eliminate ESL ripple at the input of the amplifier. In this second embodiment, Ccancel and Cin comprise a capacitive divider, matching the ESL ripple and the cancelling signal. The attenuation ratio Ccancel/Cin is almost equal to the ratio of LesI/Lout.

The transconductance gm converts the voltage difference between Vout and Vref into a current signal, where current error ierr_prop=−(gm*(Vout−Vref). The sum of the transconductance amplifier output and high pass amplifier output, where current error ierr_dif varies as (−k*dVout/dt), is compared with the offset current in the current comparator. At its trip point, the comparator holds the following equation:

$$Vout(to)+Td\ dVout/dt \approx Vout(to+Td)=Vref-Voffset \quad (1)$$

(where Td=k/gm and dVout/dt is evaluated at t=to)
The left-hand side of the equation is $1^{st}$ order Taylor approximation and predicts Vout after Td. So when the current comparator decides Vout reaches (Vref−Voffset) after Td, it trips.

Figure 9:
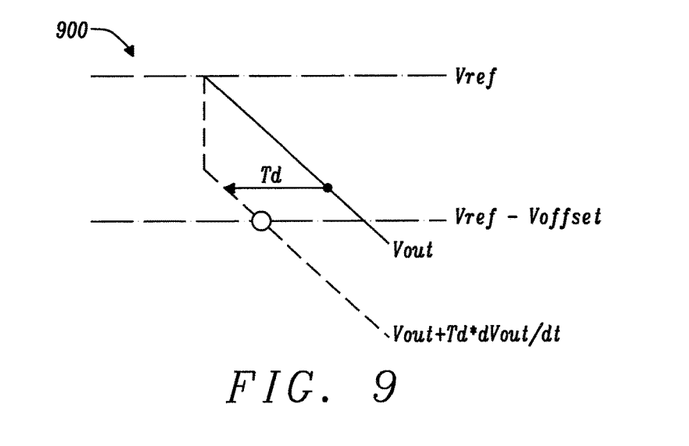
FIG. 9 shows how the output voltage is predicted, and the need for the panic comparator to react quickly to voltage drop due to load change.

FIG. 9 shows 900, how the output voltage is predicted, and the need for the panic comparator to react quickly to voltage drop due to load change. If ESL voltage ripple were not eliminated from the high pass amplifier input, it would induce large deviation on output voltage Vout of the switching converter. For example, when the low side device of the output stage is turned on and voltage LX rises, voltage ripple causes Vout to step down from Vref. Then large voltage drop Vout+Td dVout/dt is predicted, tripping the panic comparator when compared to Vref−Voffset, turning on the high side device. This kind of self-oscillation can be avoided with the implementation of the disclosure.

Figure 10:
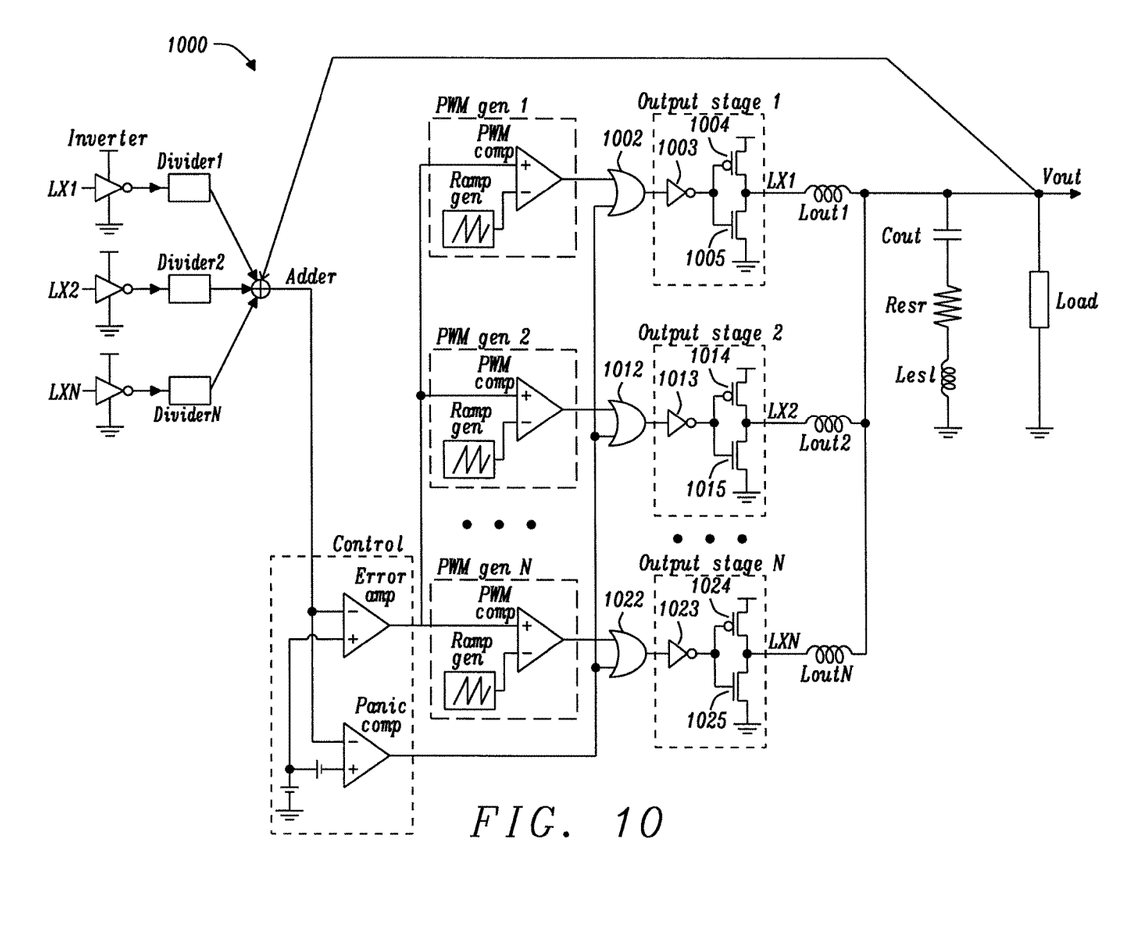
FIG. 10 illustrates a third embodiment, with a multi-phase (N-phase) Buck switching converter.

FIG. 10 illustrates third embodiment 1000, with a multi-phase (N-phase) Buck switching converter. Common output capacitor Cout is shared among the phases. Equivalent Series Inductance (ESL) of common output capacitor Cout causes output voltage ripple. It is now caused by multi-phases connected to the common output capacitor, each contributing parasitic resistance and parasitic inductance. So multiple cancelling signals are generated with inverters and dividers, and added to output voltage Vout of the switching converter in each case. A single control block, comprised of an error amplifier and a panic comparator, drive multi-phase PWM gen controls, and multi-phase output stages.

In all three embodiments, pulse-width modulation (PWM) architectures are assumed. But the idea of the disclosure is applicable and useful for no-clock type architectures, such as hysteretic type converters. In a hysteretic converter, the output stage switches when the output voltage reaches a threshold. This type of architecture relies on the ripple voltage due to Equivalent Series Resistance (ESR), because it contains the current information and is effective for stabilizing the system. The ripple voltage due to Equivalent Series Inductance (ESL) is not preferable in a hysteretic converter, because it overwrites all the other information on the output voltage.

Figure 11:
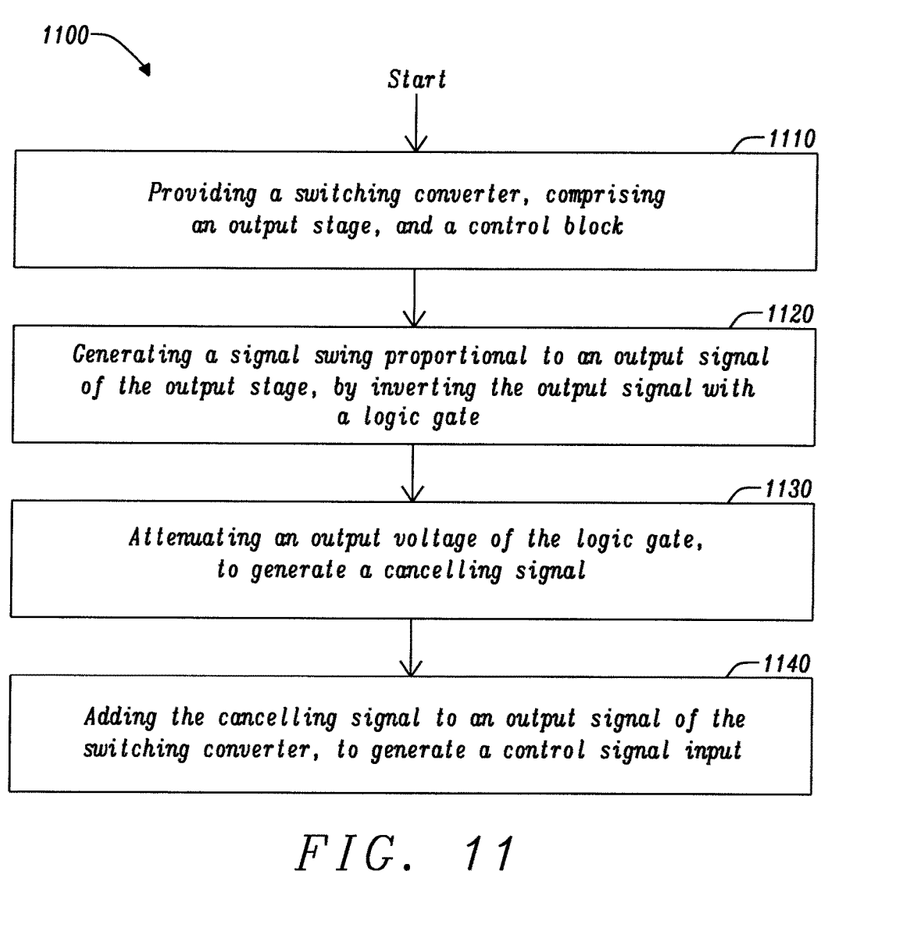
FIG. 11 is a flow chart of a method for a switching converter control circuit, robust to Equivalent Series Inductance (ESL).

FIG. 11 is flow chart 1100 of a method for a switching converter control circuit, robust to Equivalent Series Inductance (ESL). The steps include 1110 providing a switching converter, comprising an output stage and a control block. The steps also include 1120 generating a signal swing proportional to an output signal of the output stage, by inverting the output signal with a logic gate. The steps also include 1130 attenuating an output voltage of the logic gate, to generate a cancelling signal. The steps also include 1140 adding the cancelling signal to an output signal of the switching converter, to generate a control signal input.

The advantages of one or more embodiments of the present disclosure include cancelling the output voltage deviation of a switching converter using the internal switching node information. Since it is known when to turn on and off the switching devices, it can be predicted and the voltage deviation cancelled. Some of the new components of the switching converter controls can be merged and implemented to the same silicon for matching of the voltage ripple and cancelling signal.

While this invention has been particularly shown and described with reference to the preferred embodiments thereof, it will be understood by those skilled in the art that various changes in form and details may be made without departing from the spirit and scope of the invention.

The invention claimed is:

1. A switching converter, comprising:
   an output stage, configured to provide an output stage output voltage at an inductor, wherein said inductor is connected to an output capacitor at an output of said switching converter; and
   a control block, configured to control said output stage based on a control input and a reference;
   a logic gate, configured to invert said output stage output voltage, and configured to generate a signal swing proportional to said output stage output voltage;
   a voltage divider, configured to attenuate an output voltage of said logic gate, and configured to generate a cancelling signal; and
   an adder, configured to add said cancelling signal to a converter output voltage of said switching converter, to generate a control signal input.

2. The circuit of claim 1, wherein said voltage divider is resistive or capacitive.

3. The circuit of claim 1, wherein said output capacitor comprises a parasitic resistance and a parasitic inductance, wherein said parasitic resistance and said parasitic inductance generate a voltage ripple on said converter output voltage.

4. The circuit of claim 1, wherein said cancelling signal is configured to eliminate a step-like voltage deviation in said converter output voltage.

5. The circuit of claim 1, wherein said voltage divider comprises a first resistor and a capacitor connected between said logic gate output and said adder, and a second resistor connected between said converter output voltage and said adder.

6. The circuit of claim 5, wherein a ratio of said second resistor and said first resistor is configured to be a ratio of said parasitic inductance and said inductor.

7. The circuit of claim 5, wherein said capacitor is configured to be smaller than said output capacitor, and a product of said first resistor and said capacitor is larger than a switching period.

8. The circuit of claim 1, wherein said control block comprises a pulse-width modulation control loop, configured to supply said control signal input to said control block.

9. The circuit of claim 1, wherein said control block comprises an error amplifier configured to receive said control signal input, and configured to supply an input to said pulse-width modulation control loop.

10. The circuit of claim 1, wherein said control block comprises a panic comparator configured to receive said control signal input, and configured to supply said reference to said control block.

11. The circuit of claim 1, wherein said output stage comprises an inverter, a high side device, and a low side device.

12. The circuit of claim 11, wherein said high side device is PMOS and said low side device is NMOS.

13. The circuit of claim 1, wherein said panic comparator comprises a transconductance amplifier, configured to receive said converter output voltage, a current comparator, further comprising a current source and an inverter, and a high pass amplifier, further comprising a first current source and a second current source, a first device and a second device, an input capacitor connected between said converter output voltage and a gate of said first device, and a resistor connected between said gate of said first device, a gate of said second device, and a drain of said first device.

14. The circuit of claim 13, wherein a cancelling capacitor is configured to said logic gate output and is configured to provide an input to said panic comparator at said gate of said first device.

15. The circuit of claim 13, wherein a ratio of said cancelling capacitor and said input capacitor is configured to be a ratio of said parasitic inductance and said inductor.

16. The circuit of claim 13, wherein said transconductance amplifier is configured to convert a voltage difference into a current signal, and configured to supply said current signal to said inverter of said current comparator.

17. The circuit of claim 16, wherein said high pass amplifier is configured to generate a sum of an output signal with said current signal of said transconductance amplifier.

18. The circuit of claim 17, wherein said current comparator is configured to compare said current source to said sum of said output signal of said high pass amplifier and said current signal of said transconductance amplifier.

19. The circuit of claim 1, wherein said switching converter comprises a Buck switching converter.

20. The circuit of claim 1, wherein said switching converter comprises a Boost switching converter.

21. The circuit of claim 1, wherein said switching converter comprises a Buck-Boost switching converter.

22. The circuit of claim 1, wherein said switching converter comprises a multi-phase (N-phase) Buck switching converter.

23. The circuit of claim 1, wherein said switching converter comprises a hysteretic type converter.

24. A method for a switching converter control circuit robust to robust to Equivalent Series Inductance (ESL), comprising the steps of:
   providing a switching converter, comprising an output stage and a control block;
   generating a signal swing proportional to an output stage output voltage, by inverting said output stage output voltage with a logic gate;
   attenuating an output voltage of said logic gate, to generate a cancelling signal; and
   adding said cancelling signal to a converter output voltage, to generate a control signal input.

25. The method of claim 24, wherein a pulse-width modulation control loop supplies an input to said control block.

26. The method of claim 24, wherein a parasitic resistance and a parasitic inductance generate a voltage ripple on said converter output voltage.

27. The method of claim 24, wherein a voltage divider attenuates said output voltage of said logic gate.

* * * * *